(12) United States Patent
Erhart et al.

(10) Patent No.: US 6,295,621 B1
(45) Date of Patent: Sep. 25, 2001

(54) APPARATUS FOR DETECTING OUTPUT BOND INTEGRITY IN A DISPLAY DRIVER CIRCUIT

(75) Inventors: Richard Alexander Erhart; Richard Brian Nelson, both of Chandler, AZ (US)

(73) Assignee: Medtronic, Inc, Minneapolis, MN (US)

( * ) Notice: Subject to any disclaimer, the term of this patent is extended or adjusted under 35 U.S.C. 154(b) by 0 days.

(21) Appl. No.: 08/052,494

(22) Filed: Apr. 22, 1993

(51) Int. Cl.[7] .................................................... G01R 31/28
(52) U.S. Cl. .......................... 714/724; 324/522; 324/527; 324/770
(58) Field of Search .................................. 371/22.1, 22.2, 371/22.3, 22.4, 22.5, 22.6, 65; 395/183.06, 184.01, 185.01; 714/724, 735; 324/753, 770, 500, 522, 525, 526, 527; 345/87

(56) References Cited

U.S. PATENT DOCUMENTS 4,703,483 * 10/1987 Enomoto et al. .................... 714/735

* cited by examiner

Primary Examiner—Emmanuel L. Moise
(74) Attorney, Agent, or Firm—Girma Wolde-Michael

(57) ABSTRACT

A display driver circuit for driving a flat panel display including circuitry for detecting integrity of bonding of outputs of the driver circuit to the display. The bond integrity detecting circuitry includes a test mode current source which applies current to the output being tested to raise its voltage to a threshold level. At a defined sampling time following initiation of application of the test mode current, the voltage on the output being tested is compared to the threshold level, and the result of the comparison is stored and output from the driver circuit. If the voltage of the output has not reached the threshold level at the defined sampling time, the output connection is determined to be good.

6 Claims, 2 Drawing Sheets

APPARATUS FOR DETECTING OUTPUT BOND INTEGRITY IN A DISPLAY DRIVER CIRCUIT

FIELD OF THE INVENTION

The present invention pertains to a system and method for detecting shorts, bridges or opens on integrated circuit output bonds, and in particular pertains to the sensing of bonding integrity of outputs of flat panel display driver circuits.

BACKGROUND OF THE INVENTION

Applications for flat panel displays (active matrix, passive matrix, EL, . . . ) are growing. For example, active matrix flat panel displays can provide advantages over conventional LCD's in the areas of viewing angle, response time and information content. Military and commercial applications such as cockpit displays, mapping displays and imaging systems can utilize these features of flat panel displays to create extremely accurate image reproductions.

A new generation of complex display driver integrated circuits are required to implement flat panel display systems. For instance, there is a need for "next generation" display driver IC's which can take full advantage of the capabilities of current and upcoming flat panel displays by providing extreme image accuracy. Such image accuracy is obtained at the expense of space. Space is a primary concern in applications using flat panel displays because the display driver IC's will have thousands of connections between the display driver IC outputs and the associated flat panel display due to the large number of display driver IC's.

Current system architectures for LCD display drivers for example, employ both row and column display driver IC's. These display driver IC's are high speed circuits having responsibility for accurate generation of large numbers of voltage levels used to drive flat panel displays. These display driver IC's need to be fast, handle large voltages, have a multitude of outputs, provide low offset error, contain tens of thousands of transistors, and yet minimize power. These conflicting design issues require careful analysis in the light of current IC technology.

In prior art flat panel display systems, verification of display driver IC output connectivity required an additional integrated circuit in the display system to sample the outputs of the display driver IC's to be tested, a test point or "bed-of-nails" approach that probed the display driver IC outputs and looked for the proper signal waveform, or a visual inspection of the flat panel display while a test pattern was being implemented. Such verification techniques are time consuming and prone to error.

The output connections for display driver IC's are extremely fine-pitch and are a significant manufacturing and test problem for flat panel display system manufacturers. The present invention provides a solution to this problem by allowing the display connections to the display driver IC's to be tested without human interaction or visual inspection, as previously required.

SUMMARY OF THE INVENTION

The present invention provides a display driver circuit including a bonding integrity detector for detecting whether an output of a display driver circuit is bonded properly in the final application. Typically, the invention will be embodied in the form of a display driver IC containing multiple individual display driver circuits. A bonding integrity detector is incorporated into each display driver circuit within the display driver IC and can detect output shorts, bridges, or opens, on all of the display driver IC outputs.

According to the preferred embodiment of the present invention, testing of a display driver IC output begins by first driving the display driver IC outputs being tested low. A test mode signal is then activated which disables the output driver circuit coupled to each output being tested and enables a test mode current source, also coupled to the output being tested. The current provided by the test mode current source causes the voltage at the output being tested to rise at a rate which varies as a function of the capacitive load of the output. The voltage at the output being tested is monitored by switching circuitry which compares the voltage at the output being tested to a switching threshold and switches from providing a logic zero signal to providing a logic one signal in response to voltage at the display driver output being tested reaching the switching threshold.

When a display driver IC in accordance with the present invention is used with flat panel displays, an unconnected display driver IC output will typically have a capacitive load of less than 5 picofarads, while a connected display driver IC output may have a load of 50 to 500 picofarads depending upon the size of the associated flat panel display.

The difference is capacitive load between an unconnected and a connected display driver IC output will cause a corresponding time difference in the switching points of the switching circuit. The output signal of the switching circuit is sampled between the two switching point times typical for connected and unconnected display driver IC outputs, and the logic signal from the switching circuit is latched and provided to a logic output line of the display driver IC. A connected display driver IC output will thus return a logic one, while an unconnected display driver IC output will return a logic zero, allowing for a determination of the bonding integrity of the tested display driver IC output.

A time window for sampling the logic signal from the switching circuit and determining whether or not the display driver IC outputs are not bonded properly depends on capacitive load on the output, the current supplied by the test mode current source, and the switching threshold voltage of the switching circuit. The inventive apparatus may also be responsive to two bits, located in a global control register, which allow four different current settings for the test mode to accommodate various display sizes and possible sampling intervals.

Display driver IC output shorts can be identified by driving alternating highs and lows on each display driver circuit IC output, disabling the associated output drivers as described above to permit a settling time, and then sampling the signals of the associated switching circuits as discussed above. This will isolate the short to a single output or two outputs, in the case of a bridging short.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENT

Figure 1:
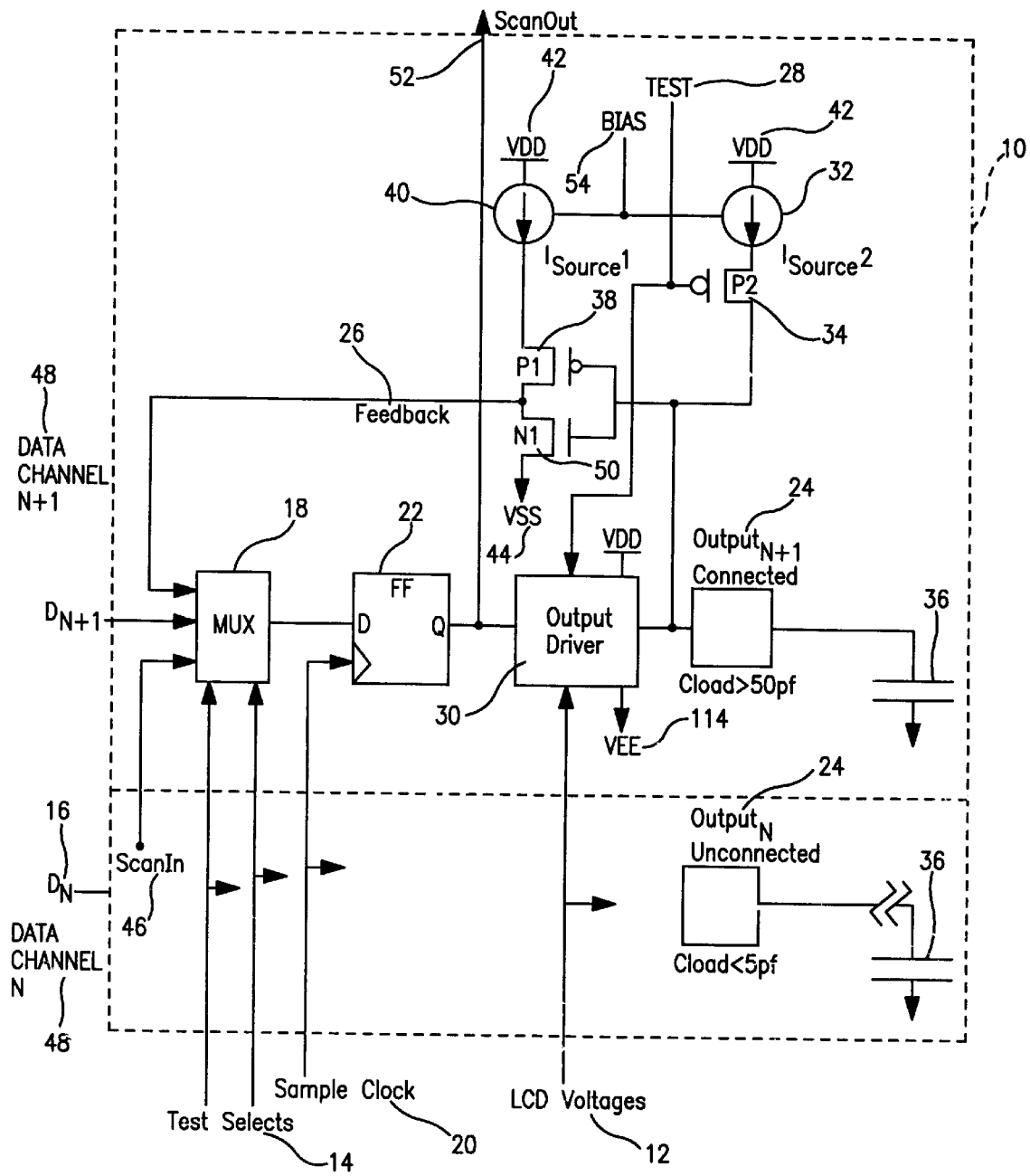
FIG. 1 is a schematic drawing of a display driver IC incorporating the present invention.

FIG. 1 is a block diagram of one embodiment of the present invention illustrating a display driver IC which includes bonding integrity detectors capable of detecting output shorts, bridges, or opens on all of its output. The embodiment as illustrated includes multiple data channels 48, each provided with a data input 16 and having a display driver output 24. Each channel 48 includes a display driver circuit, as illustrated within broken line 10. Each display driver circuit includes an output driver 30 coupled to a display driver IC output 24, switching means (38, 42, 44, 50) with a preset switching threshold and which provides a logic one signal on line 26 in response to voltage at output 24 reaching the switching threshold, a multiplexer 18 with associated data inputs 16, 26, 46 and test selects inputs 14, shift register means comprising flip flop 22 for shifting out data from multiplexer 18 on Scan Out line 52 and having a logic output coupled to the output driver 30. Also included is a test mode current source 32 for providing a programmable current level to output 24, enabled by transistor 34 in response to a signal on line 28.

Figure 2:
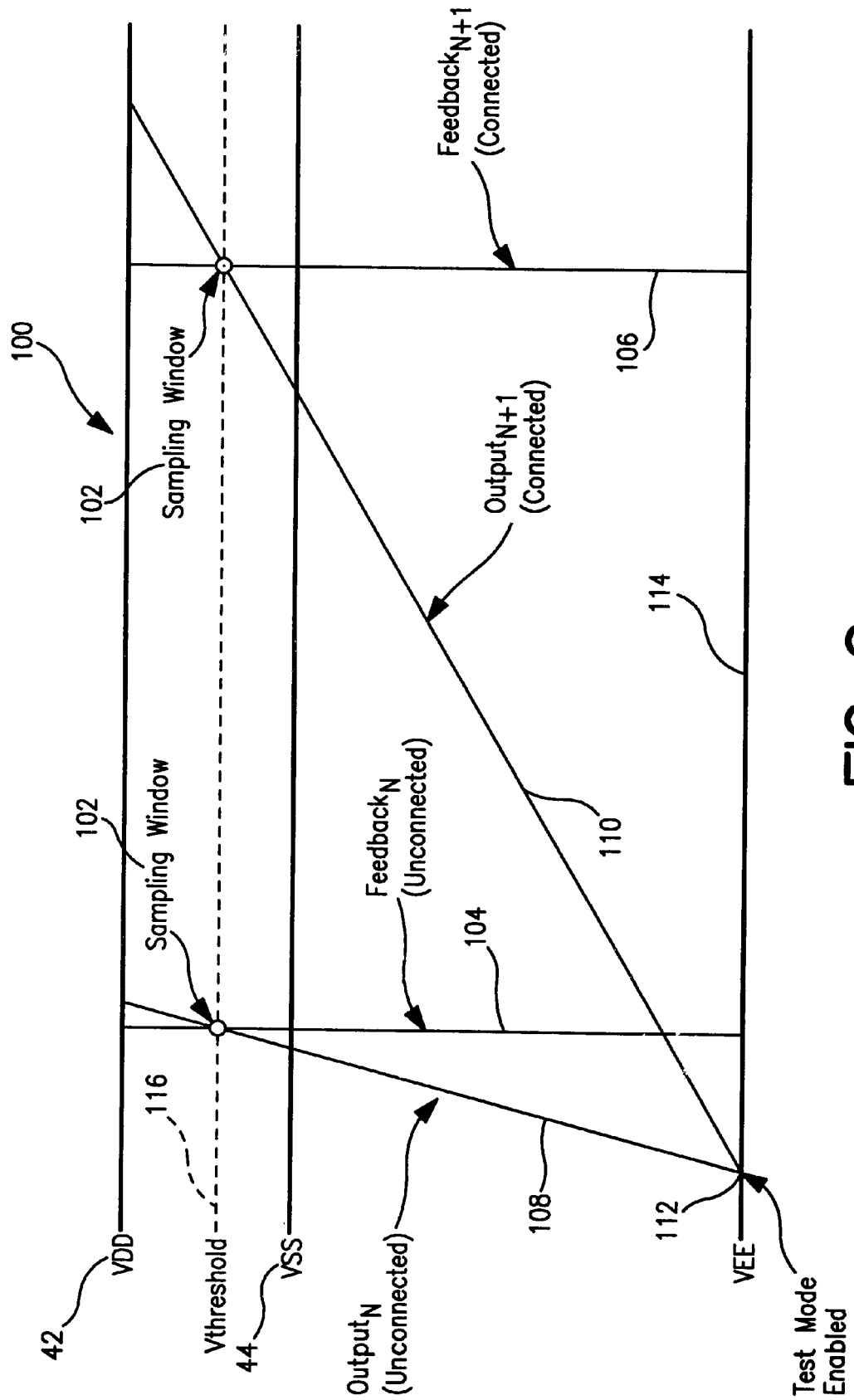
FIG. 2 illustrates waveforms which depict the voltage on the display driver IC output for both a connected and an unconnected display driver IC output.

The operation of the embodiment illustrated in FIG. 1 will now be described with the aid of and reference to FIG. 2. FIG. 2 illustrates the magnitude of the voltage on output 24 across load 36 subsequent to enabling the test mode signal. Operation of the bonding integrity test circuitry illustrated in FIG. 1 begins by initializing LCD Voltages on line 12 thereby permitting the output 24 to be driven low. Following initialization of the LCD Voltages, the Test Selects input 14 is set to pass the data $(D_{N+1})$ input 16 through the MUX 18. Next, one sample clock 20 is given to load the data $D_{N+1}$ (low) into the FlipFlop (FF) 22 and thereby drive [outputs] output 24 low. The Test Selects input 14 is then set to pass the logic signal on line 26 through the MUX 18. The voltage across load 36 is now established at VEE 114 as depicted at 112 in FIG. 2.

At this point in time, the embodiment shown in FIG. 1 is completely initialized and ready to test the integrity of the system outputs 24. The $\overline{\text{TEST}}$ input 28 is now enabled (active low), which disables the Output Driver 30, and enables the test mode current source $I_{SOURCE}2$ 32 via transistor 34 to pull up the output 24. The current value generated by [P2] $I_{SOURCE}2$ 32 is programmably dependent upon the value of BIAS input 54.

A waiting period immediately follows enablement of the $\overline{\text{TEST}}$ input signal 28. The duration of the wait period is determined by the value of the current cource $I_{SOURCE}2$ selected as well as the value of the external capacitive load 36.

The values of typical capacitive load 36 are used to establish the Sampling Window 102 as illustrated by waveform 100 in FIG. 2. For example, when used with a flat panel active matrix liquid crystal display, output 24, if unconnected will typically have a capacitive load less than 5 picofarads, while output 24 if connected may have a load of 50 to 500 picofarads depending upon the size of the display. Subsequent to disconnecting the output driver 30, the the voltage level at output 24 will have a rise time dependent upon the capacitive load ($C_{load}$) 36, and the value of the test mode current source $I_{SOURCE}2$ 32.

Transistors P1 38 and P2 34 along with current source 1 ($I_{SOURCE}1$) 40, form an invertor having a preset switching threshold determined by the VDD 42 and VSS 44 voltage values and the value of $I_{SOURCE}1$ 40. The voltage level on output 24 will have a rise time to the voltage threshold of the switching circuit (38, 42, 40, 50, 44) equal to:

$$t_r = (C_{load}/I_{SOURCE}2) \times V_{threshold}.$$

Referring now to FIG. 2, the difference in capacitive load between an unconnected and a connected output 24, will cause a time delay in the switching of the switching circuit 38, 40, 42, 44 and 50. The logic signal level on line 26 is sampled between the two switching point times 104 and 106 as established by the threshold voltage ($V_{threshold}$) 116 (FIG. 2), of the switching circuit 38, 40, 42, 44 and 50 and latched into flip flop 22 by sample clock 20. It is apparent that a connected output 24 will return a logic one on Scan Out line 52, while an unconnected output 24 will return a logic zero. The time duration for the sampling window 102 can be expressed as:

$$t_{r\ connected} - t_{r\ unconnected}.$$

For a flat panel display, typical values might be:

$C_{load\ unconnected} = 5$ pf;

$C_{load\ connected} = 100$ pf;

$I_{SOURCE}2 = 10$ uamps;

$V_{threshold} = 10$ volts;

$t_{r\ connected} = (C_{load\ connected}/I_{SOURCE}2) \times V_{threshold} = (100\ pf/10\ uamps) \times 10\ volts = 100\ usec;$ $t_{r\ unconnected} = (C_{load\ unconnected}/I_{SOURCE}2) \times V_{threshold} = (5\ pf/10\ uamps) \times 10\ volts = 5\ usec;$ $t_{r\ connected} - t_{r\ unconnected} = 100\ usec - 5\ usec = 95\ usec.$ This gives a 95 usec window for sampling the logic signal on line 26 and for determining which outputs are not bonded properly.

When the wait period is over, during the sampling window 102, one sample clock 20 is given to latch the logic level on line 26 into flip flop 22. The Test Selects input 14 is then set to pass the scan input (Scanin) 46, forming a shift register including all the flip flops 22 in all the data channels 48 within the display driver IC illustrated in FIG. 1. The final step in the output connectivity test sequence consists of clocking the shift register so formed with Sample Clock 20 and reading the results serially on Scan Out 52.

The preferred embodiment of the present invention is responsive to two bits, located in a global control register, which allow four different current settings for this test mode, ranging from 2 to 80 uamps. This will accommodate various display sizes and possible sampling intervals. Other embodiments could have more or even less programmable current values available to accommodate more or less display sizes and possible sampling intervals.

In addition to identifying unconnected display driver IC outputs 24, shorted display driver IC outputs can also be identified by driving alternating highs and lows on the display driver IC outputs of each channel 48, disabling the corresponding output drivers to permit a settling time, and then sampling and latching the corresponding switching circuit logic signals. This will isolate the short to a single display driver IC output or two such outputs, in the case of a bridging short.

The resistance in the display lines has little affect on the bond integrity testing function due to the extremely slow rise times employed. In addition, the bond integrity testing function could be used to perform limited verification of the flat panel display itself. For example, any display defect which causes a significant change in the loading (shorts, opens . . . ) could be detected by varying the sampling time.

While the invention has been described above in connection with a particular embodiment, one skilled in the art will appreciate that the invention is not necessarily so limited. It will thus be understood that numerous other embodiments, examples, uses, modifications of, and departures from the teachings disclosed may be made, without departing from the scope of the present invention as claimed herein.

For example, it should be obvious that the test mode current source described in the preferred embodiment could be replaced with a weak pullup transistor or a pullup resistor having a large resistance value. Any of these alternative embodiments would work but would produce a non-linear voltage waveform on the display driver IC output making it more difficult to determine accurate sampling intervals.

We claim:

1. A display driver circuit having an output for driving a display, comprising means for detecting integrity of bonding of said output to a display, said bond integrity detecting means in turn comprising:

means for driving said output to a first voltage level;

means for applying a test mode current to said output to change voltage on said output to a second voltage level;

means for defining a sampling time following initiation of application of said test mode current to said output; and means for indicating whether voltage on said output has reached said second voltage level at said sampling time.

2. An apparatus according to claim 1 wherein said indicating means comprises a circuit means for providing a first logic signal when voltage on said output has not reached said second voltage level and for providing a second logic signal when voltage on said output has reached said voltage level.

3. Apparatus according to claim 2 wherein said indicating means further comprises means for storing whichever of said first and second logic signals is present at said sampling time and means for outputting said stored signal from said display driver circuit.

4. An apparatus according to claim 3 wherein said logic signal providing means comprises a switch circuit and wherein said second voltage level is a switching threshold for said switching circuit.

5. An apparatus according to claim 4 wherein said storing means comprises means for latching said first or second logic signals provided by said switching circuit.

6. Apparatus according to claim 1 or claim 2 or claim 3 or claim 4 or claim 5 wherein said sampling time defining means comprises means for defining a sampling time intermediate a first time at which said voltage on said output typically would reach said second voltage level if said output was properly bonded to said display and a second time at which said voltage on said output typically would reach said second voltage level if said output was not properly bonded to said display.

\* \* \* \* \*